(12) United States Patent
Bachmann et al.

(10) Patent No.: US 9,472,922 B2
(45) Date of Patent: Oct. 18, 2016

(54) WAVELENGTH-TUNABLE LIGHT SOURCE

(71) Applicant: EXALOS AG, Schlieren (CH)

(72) Inventors: Adrian Bachmann, Romanshorn (CH); Marcus Dulk, Richterswil (CH)

(73) Assignee: EXALOS AG, Schlieren (CH)

( * ) Notice: Subject to any disclaimer, the term of this patent is extended or adjusted under 35 U.S.C. 154(b) by 142 days.

(21) Appl. No.: 14/372,946

(22) PCT Filed: Jan. 9, 2013

(86) PCT No.: PCT/CH2013/000004
§ 371 (c)(1),
(2) Date: Jul. 17, 2014

(87) PCT Pub. No.: WO2013/106942
PCT Pub. Date: Jul. 25, 2013

(65) Prior Publication Data
US 2015/0009508 A1  Jan. 8, 2015

Related U.S. Application Data

(60) Provisional application No. 61/588,797, filed on Jan. 20, 2012.

(51) Int. Cl.
| | |
|---|---|
| *H01S 3/10* | (2006.01) |
| *H01S 3/081* | (2006.01) |
| *H01S 5/14* | (2006.01) |
| *G01B 9/02* | (2006.01) |
| *H01S 5/30* | (2006.01) |
| *H01S 3/07* | (2006.01) |

(Continued)

(52) U.S. Cl.
CPC ....... *H01S 3/10023* (2013.01); *G01B 9/02091* (2013.01); *H01S 3/0812* (2013.01); *H01S 5/141* (2013.01); *H01S 5/30* (2013.01); *H01S 3/07* (2013.01); *H01S 3/0826* (2013.01); *H01S 3/08059* (2013.01); *H01S 3/105* (2013.01); *H01S 3/106* (2013.01); *H01S 5/02248* (2013.01); *H01S 5/142* (2013.01); *H01S 5/4031* (2013.01)

(58) Field of Classification Search
CPC ............. H01S 3/10023; H01S 3/0812; H01S 3/08059; H01S 3/105; H01S 3/07; H01S 3/106
See application file for complete search history.

(56) References Cited

U.S. PATENT DOCUMENTS

| | | |
|---|---|---|
| 2005/0018743 A1 | 1/2005 | Volodin et al. |
| 2005/0265403 A1* | 12/2005 | Anderson ............... H01S 5/143 372/20 |

(Continued)

FOREIGN PATENT DOCUMENTS

WO    2010/111795    10/2010

*Primary Examiner* — Dung Nguyen
(74) *Attorney, Agent, or Firm* — Rankin, Hill & Clark LLP

(57) ABSTRACT

An external cavity semiconductor laser light source comprises includes a semiconductor gain device operable to provide light amplification; a wavelength selection element including a diffraction grating; and light re-directors. The gain device, light re-directors and grating are arranged so that an optical resonator is established for light portions emitted by the gain device and diffracted by the diffraction grating. The resonator is an external cavity laser resonator. The light source is capable of varying an angle of incidence of radiation circulating in the resonator onto wavelength selection element to select a resonator radiation wavelength dependent on the angle of incidence.

38 Claims, 8 Drawing Sheets

(51) Int. Cl.
   *H01S 3/08*   (2006.01)
   *H01S 3/082*  (2006.01)
   *H01S 3/105*  (2006.01)
   *H01S 3/106*  (2006.01)
   *H01S 5/022*  (2006.01)
   *H01S 5/40*   (2006.01)

(56) References Cited

U.S. PATENT DOCUMENTS

2006/0274391 A1   12/2006  Dickson et al.
2010/0202781 A1*   8/2010  Hudgins ............... H04B 10/40
                                                          398/135

\* cited by examiner

WAVELENGTH-TUNABLE LIGHT SOURCE

FIELD OF THE INVENTION

The invention is in the field of light sources, i.e. of sources of electromagnetic radiation in the infrared, visible, and ultraviolet part of the electromagnetic radiation spectrum. More concretely, the invention concerns a light source, and an optical coherence tomography apparatus as well as a method for generating a light beam of varying wavelength.

BACKGROUND OF THE INVENTION

Tunable light sources are useful for many applications. Among them are Swept-Source Optical Coherence Tomography (SS-OCT) where the wavelength is swept back and forth fast between an upper and a lower wavelength. Other applications require DC tuning (i.e. setting the wavelength to a desired value and maintaining it for a certain time for a measurement) or sweeping at various frequencies and/or with different sweep characteristics etc.

Various methods have been employed to achieve swept light sources (in this text, generally the term 'light' relates to electromagnetic radiation not only in the visible range, but also in the near- and mid-infrared and in the near-UV, in particular to electromagnetic radiation in the range between 300 nm and 2000 nm). Among these are light sources in which a Micro-Electrical-Mechanical System (MEMS) is used for wavelength tuning. As, for example, disclosed in WO 2010/111795 A1, a grating can be used in a Littrow configuration—the incident beam and the diffracted beam are collinear (or coaxial)—but the wavelength sweep is not caused by a movement of the grating but by moving the beam incident on the grating.

BRIEF SUMMARY OF THE INVENTION

It is an object of the invention to provide a wavelength tunable light source that is tunable over a broad range. It is a further object of the invention to provide a wavelength tunable light source in which the bandwidth of the (instantaneously) outputted light is small. It is yet another object of the invention to provide a light source in which parameters of the output light vary only little over the wavelength range. An even further object of the invention is to provide a light source that is especially compact.

In accordance with an aspect of the invention, the light source, which in particular can be an external cavity semiconductor laser light source, comprises: a semiconductor gain device operable to provide light amplification; a wavelength selection element comprising a diffraction grating, in particular a transmission diffraction grating; and light re-directors; wherein the gain device, the light re-directors and the diffractive grating are mutually arranged so that an optical resonator is established for light portions emitted by the gain device and diffracted by the diffraction grating; wherein the optical resonator is an external cavity laser resonator; and wherein the light source is capable of varying an angle of incidence of radiation circulating in the resonator onto the wavelength selection element (in particular onto the diffraction grating) to select a resonator radiation wavelength dependent on the angle of incidence.

The light re-directors comprise resonator end elements between which the light in the resonator travels back and forth. The resonator end elements may be mirrors (of which one mirror may be partially transparent to couple out a portion of the light), or, in an alternative embodiment, one of the end elements may be a grating operated in reflection, e.g., the before-mentioned diffraction grating. In addition to the resonator end elements, the light re-directors may optionally comprise further mirrors, prisms, lenses etc. or other elements influencing the propagation of the light.

An aspect of the invention is based on the approach that the wavelength $\lambda$ is selected by tilting the input beam with respect to the wavelength selection element (in particular with respect to the diffraction grating): $\lambda=\text{fct}(\text{input angle})$. And the wavelength selection element directs beams of different wavelengths to different directions, and only for a particular wavelength range the resonator condition is fulfilled, whereas light portions outside this wavelength range are not capable of circulating back and forth in the resonator.

It can be provided that the diffraction grating is a transmission diffraction grating. This way, an increased resolvance may be achieved while maintaining a very small form factor of the light source, because light can be diffracted twice at the transmission diffraction grating while propagating back and forth once in the optical resonator. In this case, the optical resonator is established for light portions emitted by the gain device and transmitted through the transmission diffraction grating. Alternatively, the diffraction grating can be a reflection diffraction grating.

It can also be provided that the diffractive grating is static (stationary). This is usually the case. The diffraction grating can be mechanically fixed, e.g., with respect to a substrate. In particular, it can be fixed with respect to the light re-directors and/or to the gain device. With a static diffractive grating, the grating does not move during wavelength scanning. Very rapid wavelength scanning can be achievable with a static diffraction grating and with a direction variation device provided for changing an angle of incidence onto the wavelength selection element (more particularly onto the diffraction grating). Due to typical sizes and masses of suitable diffraction gratings, it is in many cases not possible or at least rather difficult to achieve by moving the diffraction grating high scan rates otherwise (more simply) achievable using a direction variation device.

In accordance with the present invention, the light source comprises a direction variation device capable of varying a direction of light incident onto the (usually stationary) wavelength selection element. The direction variation device may in particular deflect light coming from the gain device such that its angle of incidence onto the wavelength selection element (and in particular onto the diffraction grating) can be varied. In a group of embodiments, the direction variation device comprises a light deflector with a movable element that deflects the light, such as an actuated mirror, for example a MEMS mirror, or such as a vibrating optical fiber (more details about vibrating optical fibers and about a swept light source comprising a vibrating optical fiber can be found in "A wavelength swept laser with a sweep rate of 150 kHz using vibrations of optical fiber" by R. Isago et al., Proc. of SPIE Vol. 7004 700410-1 which is hereby incorporated by reference in its entirety into the present patent application). Depending on the application, the movable element may move in that it oscillates in a resonant manner or may move in a quasi-DC regime or in a "true" DC regime where the actual position is substantially set, at all times, by a control parameter such as a control voltage. Alternatively, a direction variation device comprises providing an electro-optic beam deflector. Under an electro-optic beam deflector we understand a device comprising a portion of material capable of varying a direction of propagation of light propagating in the material by applying an electrical signal to the material. Therein, in particular, solid materials are of interest, and more particularly, the portion of material can be a semiconductor structure or a non-linear optical crystal such as a KTN crystal. Usually, the portion of material provides an entrance face and an exit face for light. Electro-optic beam deflectors based on a semiconductor structure will be described in more detail further below. More details about electro-optic beam deflectors based on a non-linear optical crystal can be found, e.g., in the publications "A Mechanical-free 150-kHz Repetition Swept Light Source Incorporated a KTN Electro-optic Deflector" by Shogo Yagi et al., Proc. of SPIE Vol. 7889 78891J-1 and "400 kHz Beam Scanning Using $KTa_{1-x}Nb_xO_3$ Crystals" by J. Miyazu et al., CLEO/QELS, paper CTuG5 (2010), which are both hereby incorporated by reference in their respective entirety into the present patent application. The above definition of electro-optic beam deflectors comprises also devices based on the Pockels effect (Pockels cells). Since, at least according to current knowledge, Pockels-effect based electro-optic beam deflectors appear not suitable for applications in which the dimensions of the light source have to be very small or in which particularly high scan rates are required, such deflectors may be excluded in the invention.

The wavelength selection element may comprise a reflective end surface that constitutes an end element of the resonator (and is thus at the same time one of the mentioned light re-directors). In these embodiments, the wavelength selection element comprises and in particular can be a block that comprises the diffraction grating (in particular a transmission diffraction grating between two prisms) and that constitutes a resonator end element. In most embodiments, the reflective end surface constitutes a mirror. Instead of a mirror, such a reflective end surface may be an additional grating, in particular a grating in a quasi Littrow configuration.

In alternative embodiments, the resonator end element is separate from the wavelength selection element, a gas gap such as air gap being arranged between the wavelength selection element and the end element. Also in such an alternative embodiment, the end element may comprise an end mirror or may be a retro-reflective grating.

In any case, it can be advantageous to provide that the wavelength selection element is located close to a resonator end. It can in particular be provided that both, the gain element and an optical retarder (if provided) are located at the other side of the direction variation device than the wavelength selection element.

In these embodiments, light transmitted through the grating is reflected, by one of the resonator end elements, back to the grating, in particular without passing any light retarding elements, possibly except for a prism and for a possible etalon serving as periodic filter as explained hereinafter.

Advantages of such a set-up are that a small light deflector can be used (the point of incidence on the light deflector does not depend on the wavelength) as well as the possible compactness of the entire set-up.

Further, despite the compactness of the double pass concept geometry, which is immanent in the concept of placing a transmission grating within a laser resonator, brings about an increased resolvance.

The "resolvance" or "chromatic resolving power" of an element to separate wavelengths of light is defined as $R=\lambda/\Delta\lambda$, where $\lambda$ is the wavelength and $\Delta\lambda$ is the smallest resolvable wavelength difference. For diffractive elements, the limit of resolution may be determined by the Rayleigh criterion as applied to the maxima of separated light portions (diffraction maxima), i.e., two wavelengths are just resolved when the maximum of one lies at the first minimum of the other.

In further accordance with the present invention, in case of a transmission diffraction grating, a radiation deflection device (which in principle can be embodied like the before-described direction variation device) may be arranged on the "back side" of the grating, i.e. on that side of the transmission diffraction grating opposite to that side on which the gain device is arranged. Accordingly, light transmitted through the transmission diffraction grating propagating towards the radiation deflection device is reflected back to the grating by the radiation deflection device which can be a movable resonator end element. The movable resonator end element then needs a size sufficient for reflecting light portions of the whole light source bandwidth.

In further accordance with the present invention, the wavelength selection element comprises a grating-on-prism arrangement (GRISM). In this embodiment, the diffraction grating is arranged on a single prism or—more particularly, in case of a transmission diffraction grating—between two prisms. Also set-ups with more than two prisms and/or more than one grating are possible. In a GRISM, the dispersive power of the prism(s) may add to the selectivity of the diffraction grating and/or can be used such that a non-linear relation between input angle and wavelength can be flattened (smoothed). Similarly, the resolvance that in general is not uniform over the whole spectral range due to different angles of incidence onto the diffraction grating, can be flattened (smoothed) so as to show a more homogeneous resolvance over the spectral tuning range. In addition, a prism or prisms can provide mechanical protection for the diffraction grating. It is possible to provide that the grating is a surface relief transmission grating.

It is also possible to provide a prism (in particular attached to the diffraction grating, e.g., in a GRISM) having a curved entrance surface. Therein, not only concave prism shapes are possible, but also convex prism shapes are possible. In case of concave prism shapes, the entrance surface can in particular describe a circular shape. In case of convex prism shapes, the entrance surface can describe a circular shape, but it can rather describe a non-circular shape.

It is possible to provide that the wavelength selection element comprises at least one curved diffraction grating, wherein this curved diffraction grating can be identical with or different from the before-addressed diffraction grating anyway comprised in the wavelength selection element.

In one aspect of the invention, the light source comprises, in addition to the before-addressed first semiconductor gain device, a second semiconductor gain device operable to provide light amplification, wherein the direction variation device is arranged so as to be capable of receiving light amplified in the first semiconductor gain device and light amplified in the second semiconductor gain device and of varying a direction of further propagation of received light. It is, of course, also possible to provide, in addition, a third or even further semiconductor gain devices. Such light sources can make wavelength multiplexing possible. ASE (amplified spontaneous emission) spectra of the different semiconductor gain devices are usually different, they can be substantially overlapping or substantially non-overlapping. In one embodiment, the light source can make possible to simultaneously emit and scan light of two different wavelengths, in particular of clearly spaced-apart wavelengths. The first and the second semiconductor gain devices are comprised in one or in two optical resonators of the light source. Particularly, two different embodiments with (at least) two different semiconductor gain devices are described:

In a first embodiment, at least one beam splitter is provided for forming at least two separate (partial) beam paths, the first and second semiconductor gain devices being arranged in different ones of the at least two separate beam paths. In this case, both (or all) semiconductor gain devices can be arranged within one and the same optical resonator, but it is also possible to provide that two partially overlapping (or partially identical) optical resonators are formed. It is possible to use only a single direction variation device (for light produced in the first and for light produced in the second semiconductor gain device), and it can be sufficient to provide only a single wavelength selection element, e.g., a single GRISM or one of the other wavelength selection elements described in the present patent application. The separate light paths in which the different semiconductor gain devices are arranged can be considered partial beam paths, in which (at least prevailingly) light of different wavelengths propagates. These separate light paths can be considered logically parallel beam paths. By way of one or more beam splitters, the separate light paths are usually combined so as to convert them into two parallel or, more particularly, into two coaxial light paths, the corresponding parallel or even coaxial light beams impinging on the direction variation device so as to accomplish the before-described variation of direction of light incident on the wavelength selection element. This first embodiment can be particularly suitable in case of overlapping ASE spectra of these semiconductor gain devices.

In a second embodiment, in addition to the before-addressed first wavelength selection element, a second wavelength selection element is provided. And the second semiconductor gain device, the before-addressed and/or further light re-directors and the second wavelength selection element are mutually arranged so that an additional, second optical resonator is established for light portions emitted by the second semiconductor gain device. And the second optical resonator is an external cavity laser resonator, and the direction variation device is capable of varying a direction of light incident on the second wavelength selection element to select a resonator radiation wavelength dependent on the angle of incidence of the light on the second wavelength selection element. In this second embodiment, two optical resonators are formed, both making use of the same direction variation device. Consequently, it is possible to produce intrinsically synchronized wavelength scanning for light beams of (clearly) different wavelengths. This can be advantageous not only in case of optical coherence tomography applications, but also elsewhere. This first embodiment not only can be particularly suitable in case of (substantially) not-overlapping ASE spectra of the semiconductor gain devices, but also can be applied in case of (substantially) not-overlapping ASE spectra.

Making use of one and the same direction variation device for simultaneously generating light of different wavelengths does not suffer from problems coming along with using two different direction variation devices. Those problems can, e.g., in case of a movable element deflecting the light (such as an actuated mirror, e.g., a MEMS mirror) be due to manufacturability problems that make it hard to produce or find, e.g., two resonantly operable mirrors having the same (or at least a sufficiently equal) resonance frequency.

In one embodiment, the light source comprises a periodic filter (such as a Fabry Perot etalon) arranged within the laser resonator. A periodic filter helps reducing the number of modes admitted in the external laser cavity and thereby to further enhance the resolvance. During a wavelength scan, for example, operation may jump from sharply defined peak to sharply defined peak.

Such a periodic filter may be constituted by a Fabry-Perot etalon or also by any other suitable devices such as an optical ring resonator etc. It may, in accordance with a first option, be placed on the gain element side of the direction variation device. In accordance with a second option, a Fabry-Perot etalon may also be a part of the wavelength selection element or may be placed between the direction variation device and the wavelength selection element or 'behind' the wavelength selection element, i.e. between the wavelength selection element and the resonator end.

In further accordance with the present invention, the light source further comprises an optical retarder, also shortly referred to as retarder. It is also possible to provide more than one retarder. The retarder may be arranged in the optical resonator on a same side of the wavelength selection element as the side on which the gain device is arranged. It may comprise a block of (usually solid) material, a beam path with a well-defined beam path length being defined for light propagating within the retarder produced by the gain device. The optical beam path length in the retarding device may for example constitute at least 40% of the optical path length of the resonator (an optical beam path length being calculated as the physical length times the index of refraction). Generally, the retarding device comprises a plurality of reflective surfaces for reflecting back and forth light portions propagating in the block of material. In addition or as an alternative, the retarding device may be at least partially defined by a waveguide.

Such a retarder may be part of a multi-planar resonator design, wherein light guided in the resonator defines a first plane and a second plane different from the first plane, and wherein the deflection arrangement deflects light circulating in the resonator from the first plane to the second plane. The light circulating in the resonator may then, e.g., propagate in the retarder in the first plane and in the wavelength selection element in the second plane. It is furthermore possible to provide that light propagating in the resonator, in addition, propagates in a third plane. The first and second planes can be oriented with respect to each other a generally in any way, wherein a parallel orientation and, in some cases, a perpendicular orientation, can be particularly suitable. The same applies to a third and possibly existing even further planes, relative to the first and/or to the second plane.

A retarder of a (usually) solid material with a refractive index n>1 contributes less to beam divergence than if a (usually) gaseous material of a smaller refractive index would be used, and, in addition, less space is required for realizing the same optical path length. All this can contribute to enabling to manufacture particularly small light sources. These effects not only apply to retarders possibly present in the light source but also to prisms present there.

The gain device can be, e.g., a semiconductor optical amplifier (SOA). It can in particular be arranged approximately in the middle of the optical path defined by the resonator (a single trip from one end to the other end), e.g., at a position at 50%±25% of this optical path length, more particularly at a position at 50%±15% of this optical path length.

The light source may be used for any application in which wavelength tunable light sources are desired. In accordance with an example, the light source may be used as light source for swept-source Optical Coherence Tomography (SS-OCT). An OCT apparatus may comprise, in addition to the light source, an interferometer (or a portion thereof) and one or more detectors as well as further elements such as a k-clock, an absolute wavelength trigger, a scanning mechanism.

The invention also concerns an OCT module which, in addition to the light source, includes a portion of an interferometer in optical communication with the light source and operable to combine a portion of light produced by the light source and returned from a sample with a portion of light produced by the light source and returned from a reference path, and a detector unit positioned to receive so-combined light from the interferometer.

In particular, it can in addition include an optics unit, the optics unit suitable of focussing a light portion originating from the light source onto a focus point on a sample, and of performing a scan, in which the focus point and the sample are moved relative to one another.

The method for generating a light beam of varying wavelength, comprises the steps of providing a wavelength selection element comprising a diffraction grating, in particular a transmission diffraction grating; amplifying light in a semiconductor gain device; establishing an external cavity laser resonator for light portions emitted by the gain device and diffracted by the diffraction grating; varying a direction of light incident on the wavelength selection element to select a resonator radiation wavelength dependent on the angle of incidence of the light on the wavelength selection element.

BRIEF DESCRIPTION OF THE DRAWINGS

In the following, embodiments and aspects of the invention are described referring to drawings. The drawings are all schematic and not to scale, and same reference numerals refer to same or analog elements. The drawings show.

DETAILED DESCRIPTION OF THE INVENTION

Figure 1:
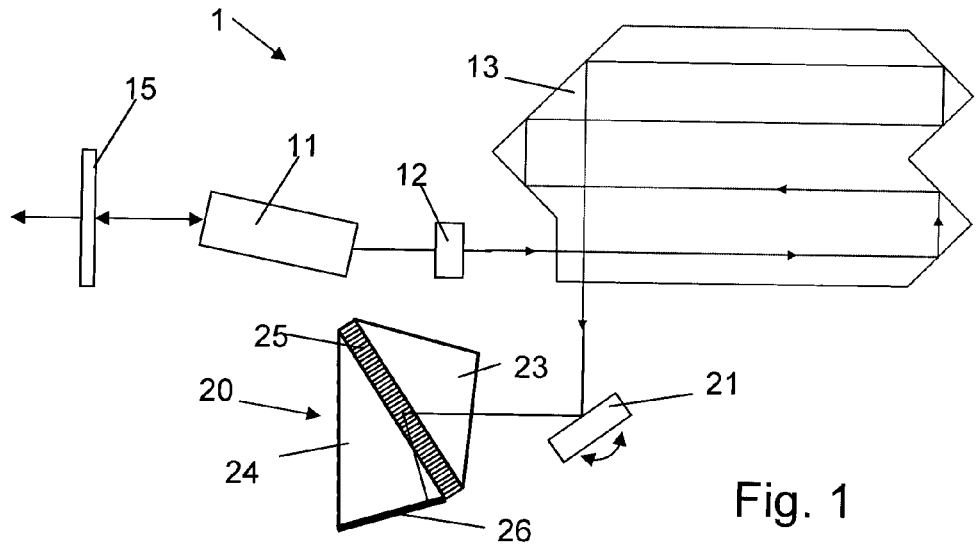
FIG. 1 is an embodiment of an external cavity laser.

A laser light source 1 of a first embodiment of the invention is shown in FIG. 1. The laser comprises a Semiconductor Optical Amplifier 11 (SOA) as a gain element (or gain device). The SOA is pumped by injecting an electric current onto a p-n junction. Electrically pumped SOAs (and R-SOAs) are known in the art and not described in any more detail here.

An optical retarder 13 serves for increasing the optical laser cavity length on a limited space. A collimating lens 12—which may be a Gradient Index lens (GRIN) or another suitable lens (e.g., an aspheric lens or an achromatic lens) or mirror (e.g., an off-axis parabolic mirror)—serves for collimating, on the gain element 11, the light circulating in the cavity. The retarder 13 comprises a block of transparent material, such as silica, glass or a polymer, with reflective surfaces. The reflective surfaces may be totally reflecting due to total internal reflection and/or due to reflective coatings applied. In addition to the reflective surfaces, the optical retarder 13 also comprises two faces that serve as incoupling and outcoupling surfaces and that are optimized for high transmission. A more detailed teaching concerning such optical retarders and their advantages can be found in WO 2010/111795 A1 incorporated herein by reference in its entirety.

The laser cavity of the laser 1 is delimited by an outcoupling mirror 15 that transmits a defined portion out of the cavity and by a wavelength tuning arrangement. The wavelength tuning arrangement comprises, as a scanning element, a movable mirror 21 (or scanning mirror) and a wavelength selection element 20 (being a dispersive element in a very broad sense of the word), in particular being in the embodiment of FIG. 1 a grating and prism arrangement 20. The grating and prism arrangement 20 (also referred to as GRISM 20) comprises two prisms 23, 24 with a transmission diffraction grating 25 between them. The transmission diffraction grating 25 may be, e.g., a volume phase holography grating (VPH grating; also called volume phase grating VPG) or any other type of transmission grating, e.g., a surface relief grating with a periodic or possibly with a chirped structure. It is to be noted that it is also possible that the diffractive grating is embodied as a reflective grating, in particular in combination with a prism (reflective GRISM), see also below.

Light propagating from the gain element side (which in one embodiment also is the retarder side: often it is advantageous if the retarder 13 and the gain element 11 are on a same side of the scanning element 21 (movable mirror), but it is also possible to have them arranged on different sides thereof) towards the wavelength selection element 20 is deflected by the movable mirror 21 and enters the first prism 23. From there it propagates to the diffraction grating 25. A first order (or possibly also higher order) diffracted beam portion in the second prism 24 propagates to a reflective end face 26 that at the same time serves as the second (in addition to the outcoupling mirror 15) end of the laser cavity. The beam impinges on the reflective end face 26 at a right angle thereto, so that it propagates back on the same path through diffraction grating 25 and first prism 23 back to movable mirror 21.

Instead of arranging SOA 11 and collimation optics 12 on one side of retarder 13 and scanning element 21 on the other (all such positions and orders and arrangements, of course relating to the light path), it would also be possible to arrange them between retarder 13 and scanning element 21.

Furthermore, beam shaping may not be accomplished solely by collimation optics 12, but, in addition, further elements or surfaces may contribute thereto, as described in this patent application, e.g., entrance surfaces of prisms or further diffraction gratings.

When the movable mirror scans (in the illustrated embodiment schematically depicted by a rotational movement around an axis perpendicular to the drawing plane), then the point of incidence and the angle of incidence on the transmission grating 25 change, and consequently, the wavelength for which the condition that the light is incident on the reflective end face 26 at a right angle is fulfilled changes. As a consequence, the resonator wavelength (or resonator wavelength range) can be scanned by movement of the mirror 21. Refraction at the end faces of the prisms of the grating and prism arrangement 20, i.e. at those faces of the prisms through which light enters or exits the grating and prism arrangement 20, may add to the diffractive power of the grating and prism arrangement 20. In the embodiment of FIG. 1, this applies to prism 23 only (namely to that surface of prism 23 which is drawn at the right hand side in FIG. 1), and would apply to prism 24 if reflective end face 26 were not present, but replaced by a mirror not (or at least not fully) attached to prism 24. Such refractive prism end faces may contribute to "flattening" (smoothening or making more constant) the total dispersion of the wavelength filtering accomplished in the light source 1 in order to provide a more constant resolvance for all wavelengths. Typically, for relatively longer wavelengths the resolvance of the grating is higher than for relatively smaller wavelength (which, generally, could also be vice versa), hence tilted surfaces (such as the prism end faces) can be arranged in such a way that an elliptical beam shape on the grating 25 is achieved from an initially round beam. The thus achieved utilization of a larger number of grating lines can be adjusted for "flattening" resolvance.

An advantage of a configuration in which a grating (grating 25) is passed twice is that the resolving power (resolvance) for a given number of illuminated grating lines is increased. In addition, because of the effect of the prisms and the possible geometry with less flat angles of incidence onto them (cf. the paragraph above), the resolvance of the dispersive element 20 is flatter (more constant) over the spectral range than for a standard reflective grating in a Littrow configuration that is typically oriented so as to be operated with high incidence angles of about 70° and more. The thus achievable flatter (more constant) resolvance characteristics improves the spectral performance relative to the case of a similar reflective grating (in particular with no prism attached).

A further advantage is that despite being a double pass configuration, the dispersive element is still compact, especially if, as depicted, the end face of the second prism 24 is reflecting, or if a reflecting end of the resonator is placed in close proximity to the GRISM arrangement. A reflective end face 26 may be formed by a mirror (provided by coating or by attaching, e.g., gluing, a pre-fabricated mirror), or may be an integrated or an attached reflection grating.

Figure 2:
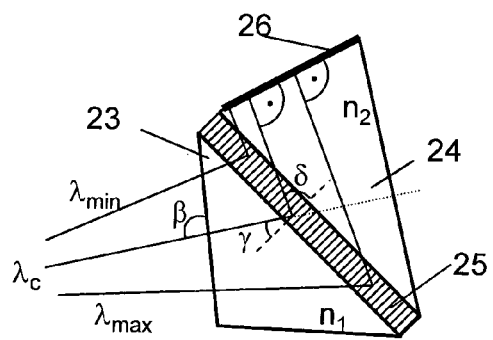
FIGS. 2-4 are embodiments of wavelength selection elements that also constitute cavity ends.

FIG. 2 shows in somewhat more detail a GRISM dispersive element of the kind shown in the laser of FIG. 1. Also depicted are beam paths of beams of three different wavelengths, a minimal wavelength $\lambda_{min}$, a central wavelength $\lambda_c$ and a maximum wavelength $\lambda_{max}$. The indices of refraction $n_1$, $n_2$ of the first and second prisms 23, 24 may be equal or different. It is also possible that $n_1=1$ and/or that $n_2=1$, in which case one or both of the prisms may be dispensed with and replaced by air or a protective gas. In many situations, $n_1>1$ and $n_2>1$ is preferred, and for practical reasons (but not necessarily) often $n_1=n_2$ is chosen. The angle of incidence β on the first prism 23 could be chosen to be different from 90° (for all angles occurring during scanning, and thus for all wavelength from $\lambda_{min}$ to $\lambda_{max}$), so as to prevent a further resonator mode by light portions reflected by the prism 23. In FIG. 2, such further resonator modes are not present for a portion of angles under scanning operation; only near $\lambda_{max}$, this is not the case. Dashed line in FIG. 2 shows the normal on the interface between the material constituting the transmission grating 25 and the first prism as well as the normal on the interface between the material constituting the transmission grating 25 and the second prism. The angles γ and δ between the incident beam and the (typically first order) diffracted beam, respectively, and the respective normal may be equal (symmetric configuration with respect to the grating) or different (asymmetric configuration). Note that angles at diffraction gratings reference to the surface normal of the grating, whereas the angles at refractive surfaces are, in the figures, drawn to reference the surface, but when using these angles in calculations, e.g., in the Snellius equation, the angle referencing to the surface normal has to be taken, as is clear to any person skilled in the art.

Further, the index of refraction $n_1$ and the geometry of the set-up have to be chosen so that at the maximum angle γ (at the maximum wavelength $\lambda_{max}$ in the depicted configuration) is below the critical angle for total internal reflection (TIR). TIR can occur if the entry prism 23 has a larger refractive index $n_1$ than the grating structure (or grating layer), or if a bonding material such as optical cement present between prism 23 and grating 25 has a lower refractive index than prism 23.

Figure 3:
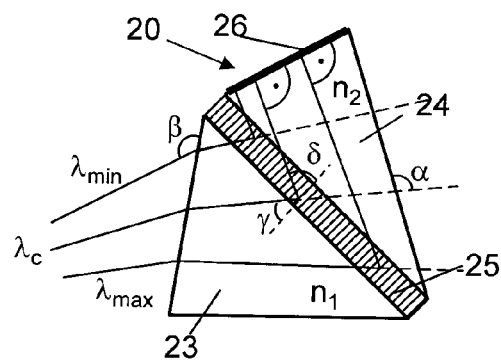

Another variant of the GRISM dispersive element 20 is shown in FIG. 3. The entry surface (i.e. the surface of the first prism 23 on which the beam deflected by the movable element is incident) is tilted with respect to the orientation it has in the configuration of FIG. 2. Such a tilt like present in the shown orientation, leading to angles of incidence β>90° (with β defined as shown in the figures) for all incident beams occurring during scanning, prevents or at least reduces residual reflections inside the laser cavity and may also help to flatten (smoothen) the resolvance characteristic of the dispersive element 20 (i.e. to make more constant the wavelength-dependence of the resolvance). The angle of incidence on the first prism 23 of smaller wavelength light for which the resonator condition is fulfilled is more obtuse than the angle of incidence on the prism 23 of larger wavelength light for which the resonator condition is fulfilled. As a secondary effect, the dispersion of prism 23 adds to the overall dispersion. The outer surface of the second prism 24 is approximately parallel to the diffracted beam paths (and approximately perpendicular to the reflective coating 26), or arranged at a different angle ensuring that an angle α of incidence of the zeroth order diffracted beam is not perpendicular to this outer surface, again to avoid a further undesired laser mode.

Figure 4:
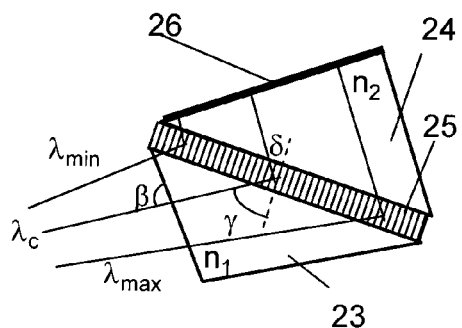

FIG. 4 shows an even further variant. The entry surface is tilted to achieve $\beta<90°$ (for all angles of incidence occurring during scanning), and incidence on the grating is relatively flat (e.g., $\gamma>50°$). Again, this may suppress residual reflections inside the laser cavity. The configuration of FIG. 4 enhances the maximum resolvance for $\lambda_{max}$, because of the occurring deformation of the beam shape caused by prism 23. E.g., in case of a (cross-sectionally) round beam impinging on the entry surface of the prism 23, the beam continues inside prism 23 having a slightly elliptical shape. The smaller β (for higher λ), the more pronounced this effect.

Figure 5:
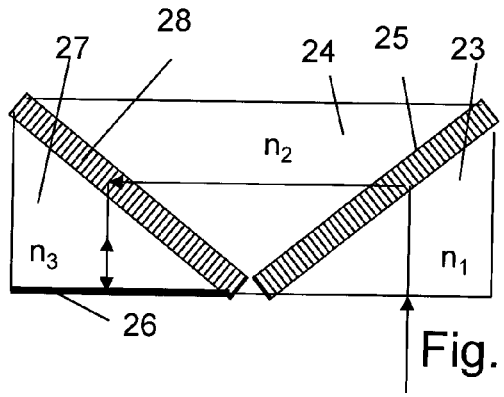
FIG. 5 is an embodiment of a wavelength selection element with two transmission gratings.

An even further enhanced resolvance (at the cost of a decreased bandwidth and/or an increased assembly size) is achieved by a multi-pass arrangement with more than two passes through one or more gratings as shown in FIG. 5. Shown is a bulk assembly (for example cemented) in which three prisms 23, 24, 27 are attached to each other, with transmission gratings 25, 28 between pairs of prisms 23, 24 and 24, 27, respectively. The last prism 28 is again provided with a reflective surface 26.

Similar effects as the one described for the configuration of FIG. 5 could also be achieved by placing two or more transmission diffraction gratings in a row, with a reflector at the end, or by placing a transmission GRISM and a reflective arrangement (for example a reflective GRISM as illustrated in one of FIGS. 2-4) in a row.

Figure 6:
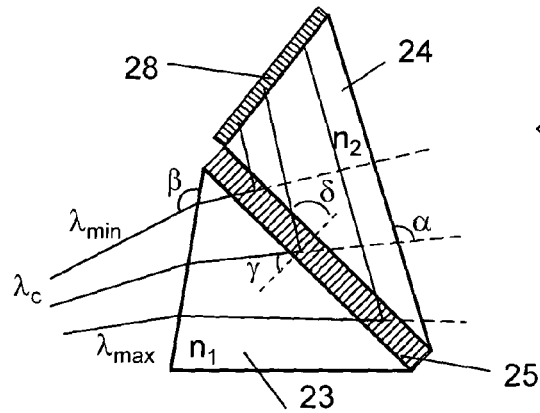
FIG. 6 is an embodiment of a wavelength selection element with an additional grating operated under quasi Littrow conditions.

FIG. 6 shows a variant in which the second grating 28 serves as a reflective grating (which may, e.g., be a holographic or a surface relief grating) instead of a transmission grating and replaces the end reflector 26 of the previous embodiments, grating 28 being arranged in a quasi Littrow configuration.

Configurations with more than one grating relax the requirements for the grating line density for a given desired dispersion or increase the resolvance by increasing the number of illuminated grating lines, depending on the needs.

Figure 13:
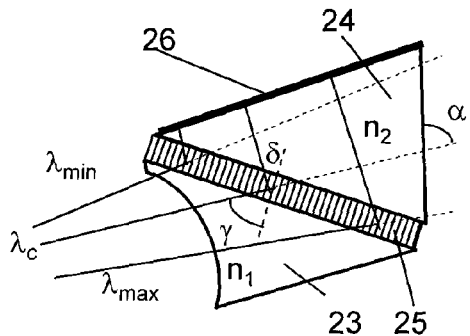
FIG. 13 is an illustration of a wavelength selection element embodied as a GRISM comprising a prism with a concave face.

FIG. 13 shows a wavelength selection element (more particularly a GRISM) comprising a prism 23 with a concave face, more particularly comprising a light entrance face having a concave shape. The entry surface here describes a portion of a cylinder (inner) surface. The shape can be adjusted to the direction variation device, more particularly to the relative position and orientation of the GRISM and the concave prism face. For example, in case of a MEMS mirror as the direction variation device 21 and with a circular shape of radius R of the prism face, the tilting axis of the MEMS mirror can be placed in a distance of R with respect to the circular prism face (the axis of rotation of the MEMS mirror perpendicular to the plane in which the circle of radius R is described). This way, no use of a possible refraction at the concave prism face is made for either increasing and/or flattening the overall resolvance, or for reducing a required maximum deflection angle of the direction variation device 21. It can be advisable to provide that the beam impinging on the concave prism face is (slightly) convergent (in the plane in which the prism surface is curved), because that way, it can be provided that the beam is collimated (in the plane in which the prism surface is curved) when impinging on the grating 25. Of course, it is also possible to place the tilting axis of the MEMS mirror (or a corresponding axis or point of a different direction variation device) elsewhere than mentioned above, see, e.g., the case depicted in FIG. 13.

Figure 14:
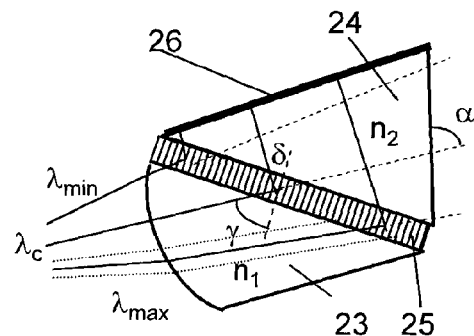
FIG. 14 is an illustration of a wavelength selection element embodied as a GRISM comprising a prism with a convex face.

FIG. 14 shows a wavelength selection element (more particularly a GRISM) comprising a prism with a convex face, more particularly a light entrance face describing a convex shape. The entry surface here describes a portion of a cylinder (outer) surface. The shape can be adjusted to the direction variation device, more particularly to the relative position and orientation of the GRISM and the convex prism face. Such a design may require accomplishing a larger (angular) deflection of the incident light and thus a larger scanning amplitude of the direction variation device. But, on the other hand, it is possible to focus the beam onto the direction variation device, in particular onto a corresponding MEMS mirror which again may make possible to use a smaller MEMS mirror which, again, is better suitable for larger scanning amplitudes and high scan rates. The concave surface may describe a circular shape, but the provision of a non-circular (aspheric) shape allows to optimize the local curvature for the one wavelength present at that location allowing the local curvature to function as a wavelength-optimized lens, e.g., for additional collimation. And in addition, the effect of aberrations can be minimized.

Of course, curved prism faces such as the concave and convex ones described for the embodiments of FIGS. 13 and 14, respectively, can also find application in other embodiments described in the present patent application.

Figure 15:
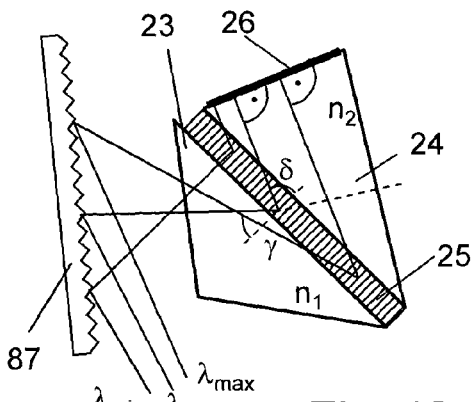
FIG. 15 is an illustration of a wavelength selection element embodied as a GRISM plus a separate grating.

FIG. 15 shows a wavelength selection element, more particularly a GRISM plus a separate (reflective) grating 87. The resolvance is an important magnitude in the light source, since it considerably influences the coherence length of the generated light. When using a wavelength selection element as shown in FIG. 15, an improved (increased) resolvance can be achieved, because an increased number of lines of grating 25 and an increased number of lines of grating 87 can be illuminated. This is due to the grazing incidence on grating 87 (typically above 45° to the grating normal combined with a diffraction angle relatively close to the surface normal). Using an initially round beam, the beam will describe on grating 87 an elliptic shape, thus illuminating more grating lines on grating 87 and especially on grating 25, an increased number of lines will be illuminated with respect to a configuration as shown, e.g., in FIG. 2.

Figure 16:
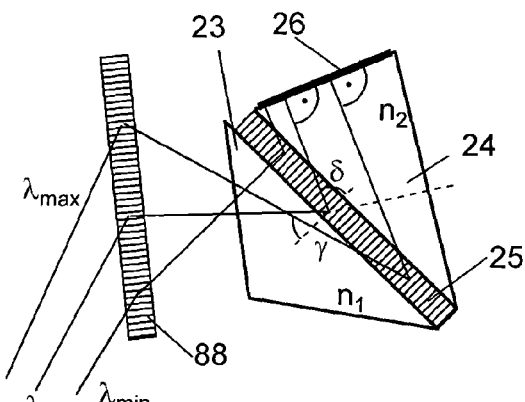
FIG. 16 is an illustration of a wavelength selection element embodied as a GRISM plus a separate grating.

Similar effects as achievable with the embodiment shown in FIG. 15, can also be achieved with the embodiment of FIG. 16. Therein, a transmission diffraction grating 88 is used instead of the reflection diffraction grating 87 in FIG. 15.

Figure 17:
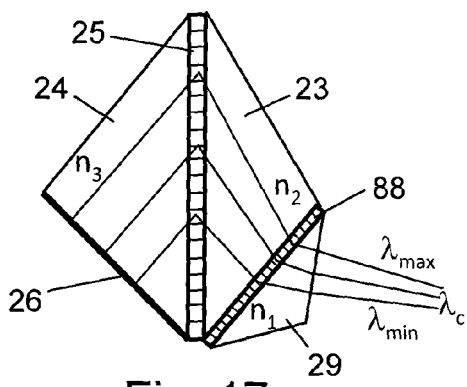
FIG. 17 is an illustration of a wavelength selection element embodied as a GRISM with two transmission diffraction gratings and three prisms.

Again similar effects can be achieved with an embodiment shown in FIG. 17. Therein, transmission diffraction grating 88 is attached to prism 23 which is attached to transmission diffraction grating 25. And, an additional prism 29 is (optionally) attached on the other side of grating 88. Accordingly, here, the wavelength selection element comprises or rather is a GRISM comprising two gratings and three prisms.

Figure 18:
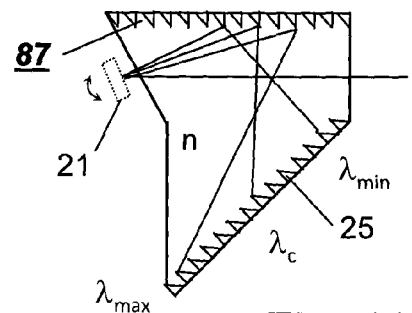
FIG. 18 is an illustration of a wavelength selection element embodied as a GRISM with two reflection diffraction gratings.

Also with two reflective gratings, the above-described effects can be achieved, as illustrated in FIG. 18. Therein, a direction variation device 21 is sketched, too (in dotted lines). In this embodiment, light traverses the prism of the GRISM on its way between gain device and direction variation device 21, but traversing the prism on that path, the light beam is not diffracted at a grating.

Figure 19:
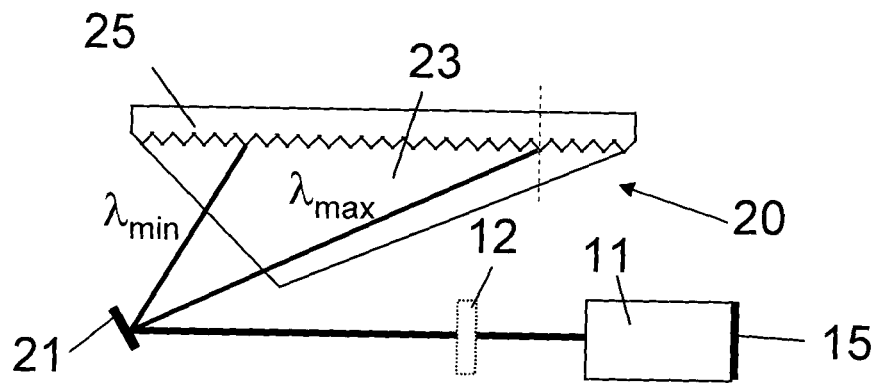
FIG. 19 is an illustration of a light source with a wavelength selection element embodied as a GRISM with one reflection diffraction grating.

In FIG. 19, a rather simple embodiment is illustrated in which a GRISM is used as a wavelength selection device which comprises one prism 23 and one reflection diffraction grating 25. The latter is in Littrow configuration. Also here, the above-described effect of an increased resolvance due to grazing incidence on the grating combined with an optically denser medium, e.g., glass, attached to the grating is achieved. Usually, in such an embodiment, a collimated beam (e.g., produced by way of generally optional collimation optics 12) enters the prism 23.

Figure 20:
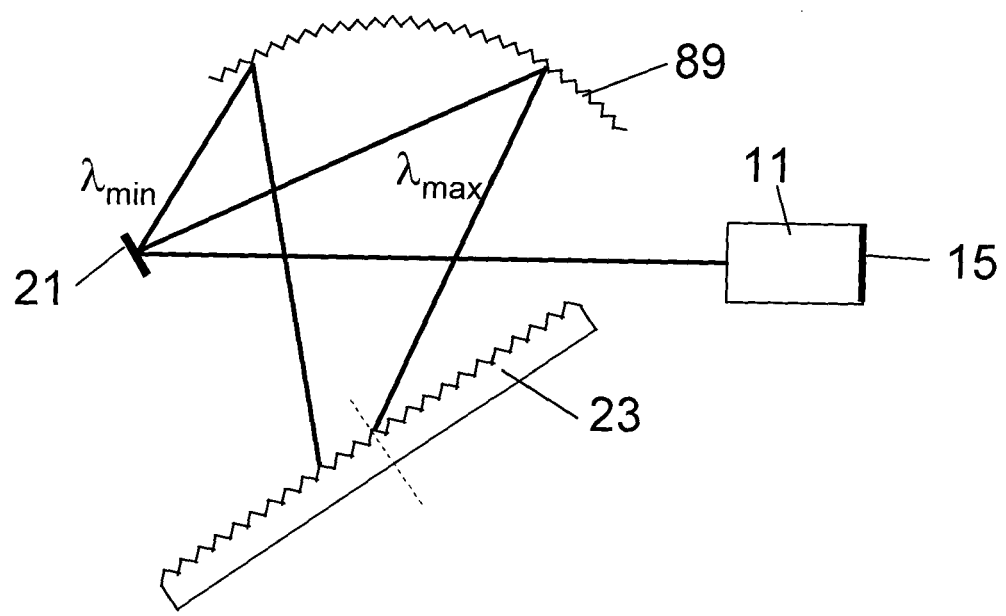
FIG. 20 is an illustration of a light source with a wavelength selection element embodied as a GRISM with a curved diffraction grating.

FIG. 20 illustrates an embodiment, in which a curved grating 89 is used. In this case, the light beam between direction variation device 21 and curved grating 89 usually is a divergent beam, and between curved grating 89 and the grating 23 under quasi Littrow condition, the beam is a collimated beam (as achieved by way of the curvature of grating 89). Of course, it is possible to provide that the two gratings are both attached to a prism, more particularly to one and the same prism (not illustrated in FIG. 20).

Figure 7:
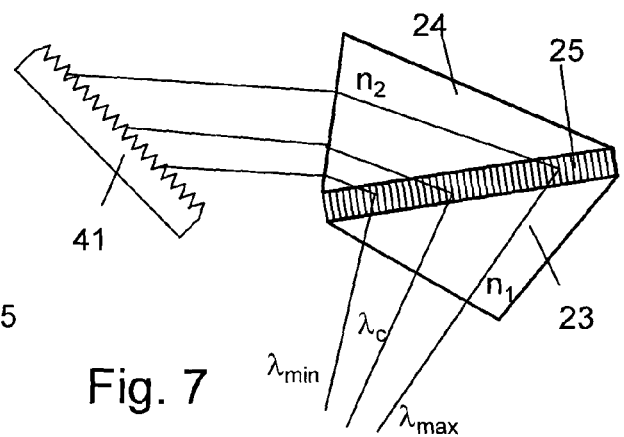
FIG. 7 is an embodiment of a wavelength selection element comprising a separate resonator end constituted by a reflective grating.

In FIG. 7, the second grating 28 of FIG. 6 that is part of the GRISM and integrated in or attached to (typically cemented to) the second prism 24 is replaced by a separate, classical reflective grating 41. Instead of a reflection grating 41, an additional wavelength selecting element, e.g., a prism, plus a reflector could be added for increasing transmission efficiency. Even though this would reduce the advantage of increased resolvance for better spectral bandwidth (and the GRISM would be a transmission and not a reflection GRISM anymore), such an alternative configuration may be advantageous in special circumstances. As a further alternative, one could omit prism 24 and/or prism 23.

As a further variation, both indices of refraction $n_1$, $n_2$ could be chosen to be (approximately) equal to 1, so that the dispersive element is not a GRISM anymore but just a stand-alone transmissive grating.

In accordance with a group of embodiments, the dispersive wavelength tuning arrangement is combined with or comprises a periodic filter. This results in a periodically (in k-space, not in λ-space) increased coherence length by reducing the number of modes admitted in the external cavity laser due to a combination of well chosen spectral characteristics of the dispersive element (GRISM or other) and the periodic filter.

Figure 8:
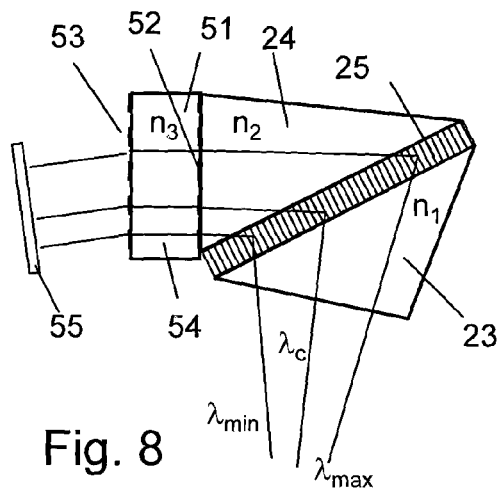
FIGS. 8 and 9 are embodiments of wavelength selection elements with Fabry-Perot periodic filters.
Figure 9:
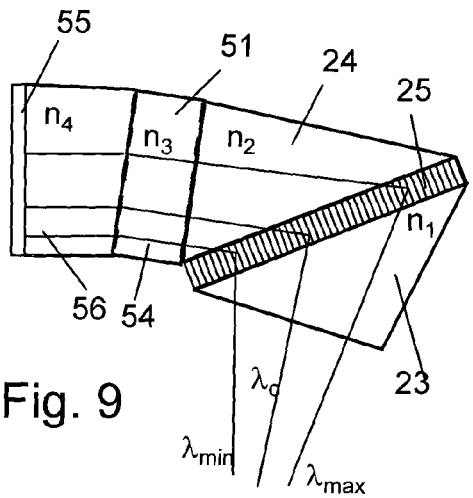

In the embodiments of FIGS. 8 and 9, this periodic filter is a Fabry-Perot etalon that is combined with the wavelength tuning arrangement.

In FIG. 8, the periodic filter is a Fabry-Perot etalon 51 integral with the GRISM. The end reflector 26 of the previously described embodiments is replaced by separate reflecting surface 55 forming a resonator end. The Fabry-Perot etalon 51 has a partially transmissive mirror 52 at the interface to the second prism 24 and a further partially transmissive mirror 53. The transparent optical medium 54 between the two mirrors 52, 53 of the Fabry-Perot filter may have an index of refraction $n_3$ that can be equal to one or both of the indices of refraction $n_1$, $n_2$ of the prisms 23, 24 or different thereto. In a special case, the optical medium may be a gas, e.g., air. The etalon 51 is tilted with respect to the incident light, more particularly to light incident from grating 25 and/or to light incident from reflective surface 55.

FIG. 9 shows a variation of the principle illustrated in FIG. 8. Again, the etalon 51 is tilted with respect to the incident light, more particularly to light incident from grating 25 and/or to light incident from reflective surface 55. Between the etalon 51 and the separate reflecting surface 55, there is a further block of (solid) transparent material 56 with an index of refraction $n_4$ which may be smaller than, larger than or equal to the index of refraction of the transparent optical medium 54 of the tilted Fabry-Perot etalon 51. In accordance with an alternative option, the space between the etalon 51 and the separate reflecting surface 55 may be filled by a gas, e.g., by air.

In embodiments comprising a periodic filter, the periodic filter does not need to be a Fabry-Perot etalon and/or does not need to be a part of the dispersive arrangement, i.e. it may also be on the gain element side of the movable element 21 in the laser resonator.

Figure 10:
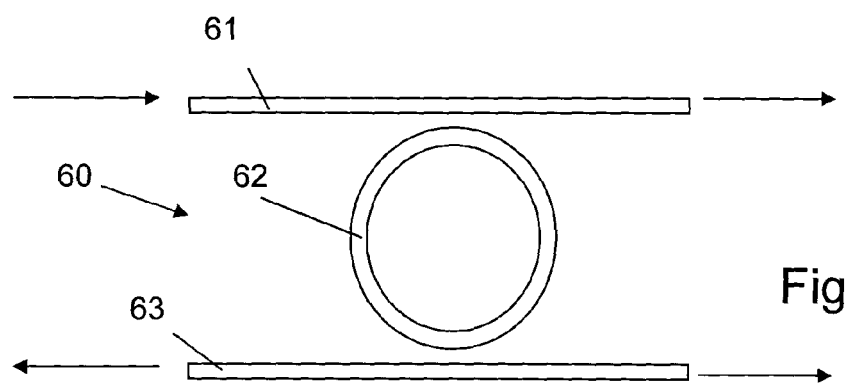
FIG. 10 is an alternative embodiment of a periodic filter.

A schematic representation of an alternative periodic filter 60 is shown in FIG. 10. Light circulating in the cavity is guided in a first optical waveguide 61 that is coupled to an optical ring resonator 62. The amount of light that is coupled out of the first waveguide 61 and into the ring resonator 62 depends on the wavelength of the light, more particular depends on the wavelength of the light in a (wavelength-) periodic way. Depending on the requirements, the light that is transmitted through such a filter may be constituted by the light transmitted through the first waveguide 61 or by the light coupled, via the ring resonator 62, into an optional second optical waveguide 63. In the former case, the first waveguide 61 constitutes a part of the cavity. In the latter case, one branch of the first waveguide 61, the ring resonator and one branch of the second waveguide 63 constitute part of the cavity.

Further embodiments of periodic filters (or frequency combs) are possible and can be part of a laser resonator of a laser according to embodiments of the invention.

Figure 21:
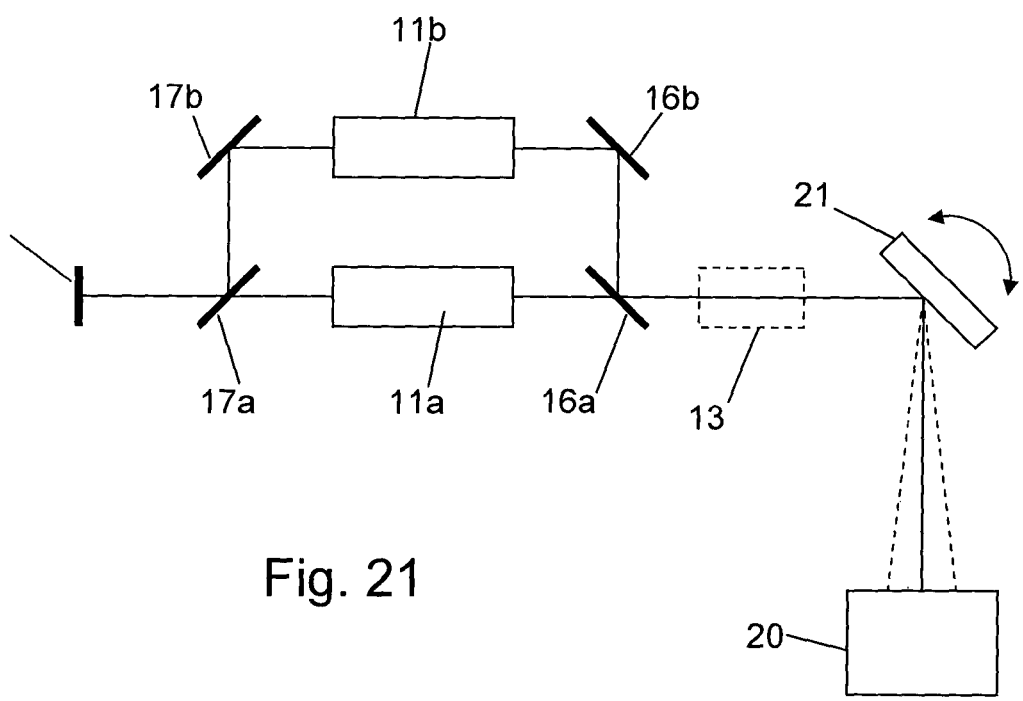
FIG. 21 is an illustration of a light source with two gain devices allowing for wavelength multiplexing.
Figure 22:
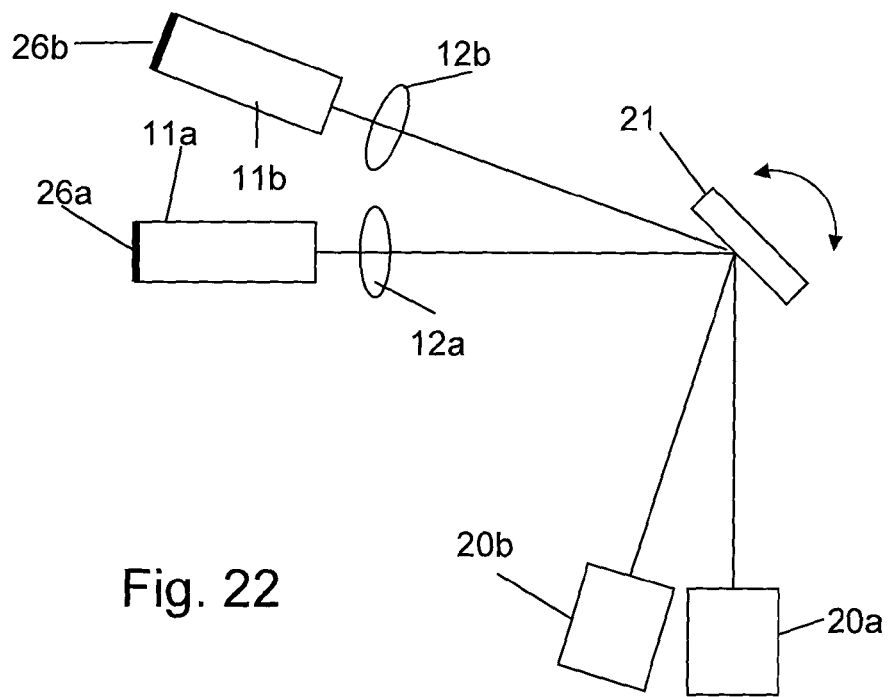
FIG. 22 is an illustration of a light source with two gain devices allowing for wavelength multiplexing.

Two embodiments suitable for simultaneously generating two light beams of different wavelengths are illustrated in FIGS. 21 and 22. In both cases, two separate gain devices 11a, 11b are provided which have different ASE (amplified spontaneous emission) spectra. One and the same direction variation device 21, e.g., a movable mirror, is used in the light source. This can provide intrinsically synchronized simultaneous wavelength scanning over different wavelength ranges.

In FIG. 21, two logically parallel (partial) beam paths are created, each comprising one semiconductor gain device 11a and 11b, respectively. This is accomplished using beam splitters 16a, 16b, 17a, 17b, wherein the term "beam splitter" is meant in a very broad and general sense. They can all be conventional beam splitters, e.g., based on semi-transparent mirrors, and beam splitters 16b and 17b could also be (conventional) mirrors, whereas beam splitters 16a and 17a could also be WDM combiners (wavelength division multiplexing combiners). Outcoupling mirror 15 is common for light produced in any of the gain devices 11a, 11b. Like in other embodiments, a retarder 13 (schematically illustrated using dashed lines) can be a valuable option. At beam splitter 16a, light beams of different wavelengths are made parallel or even coaxial, such that two parallel or two coaxial light beams of different wavelengths impinge on direction variation device 21, and in a before-described way, an angle of incidence of light incident on wavelength selection element 20 is varied (as indicated in FIG. 21 by dashed lines). Two separate collimating optics (one in each partial beam path) or one common one can be provided.

It is also possible to replace beam splitters 17a and 17b and outcoupling mirror 15 by one common outcoupling mirror or by two separate outcoupling mirrors (one for each partial beam path) or by mirrored (reflective) ends of the gain devices 11a,11b. In that case, two partially identical (partially overlapping) optical resonators are formed.

The beam splitters can be polarization-dependent ones or polarization insensitive.

In particular in case the maxima of the ASE spectra are rather far apart, it can be provided to use a higher diffraction order beam for light produced in a first one of the gain devices 11a,11b (in order to cope with the limited wavelength range within which a diffraction grating is operable.

In FIG. 22, two optical resonators are formed, each comprising a gain device (26a/26b), possibly a collimator (12a/12b) and a wavelength selection element (20a/20b). Both resonators share direction variation device 21, e.g., a MEMS mirror. The gain devices 11a, 11b can be mirrored like illustrated in FIG. 22 (reflective end faces 26a, 26b), but separate mirrors or even a common mirror or others could also be provided so as to form resonator ends.

From the above, it is clear, how the embodiments of FIGS. 21 and 22, respectively, can be generalized to three or even more gain devices, thus making possible the emission of simultaneously wavelength-scanned light or two or more than two different wavelengths. Wavelength multiplexing can be useful, e.g., in optical coherence tomography apparatuses, but also elsewhere.

Furthermore, the optical amplifiers can be modulated in time, e.g., in order to reduce ASE background while not lasing, and/or for spectrally flattening the outputted light, and/or for other reasons.

Figure 11A:
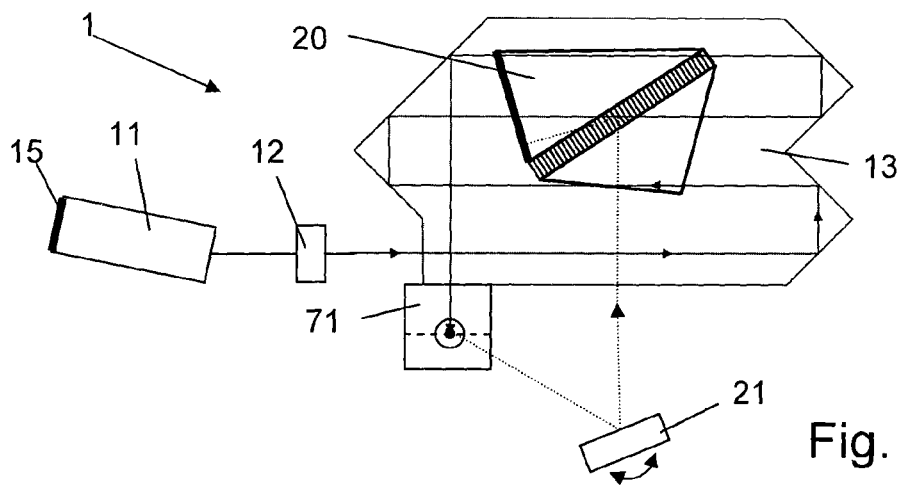
FIGS. 11a and 11b are a top view and a partial elevation view, respectively, of another embodiment of a laser.
Figure 11B:
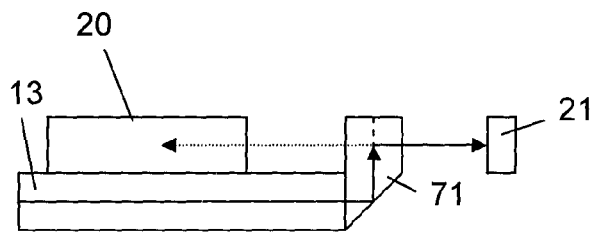

Special features of, for example, especially compact embodiments of lasers are depicted in FIGS. 11a and 11b. FIG. 11b shows the wavelength scanning arrangement of the laser of FIG. 11a in a schematic side view.

A first feature of the laser of FIG. 11a is that the gain element 11 is a Reflective Semiconductor Optical Amplifier (R-SOA). The cavity end mirror 15 is constituted by a partially reflective coating of the gain element 11. This first feature brings about the advantage that less coupling losses are encountered in the cavity. Embodiments with separate mirrors (as in the case of non-reflective SOAs as gain elements), on the other hand, have less tendency to encounter spatial hole burning and, in general, are less sensitive to multi-mode operation (coupled laser cavities).

A second feature of the laser of FIGS. 11a and 11b, that can be implemented independent of the first feature (i.e. one can implement only the first, only the second, both or none of these features) is a multi-layer planar design. While the light is guided through the gain element 11, collimation optics 12 and retarder 13 essentially in a first plane, a deflection arrangement 71 guides the light to a second plane that is parallel to the first plane, wherein, in general, an arbitrary mutual alignment or orientation of the first and second planes is possible. In the wavelength tuning arrangement comprising a dispersive wavelength selection element 20, such as a GRISM 20, and a movable mirror 21, the light is guided in the second plane.

In particular, the GRISM 20 may be placed on top of the retarder 13. For example, it may be attached to it, for example by gluing.

Figure 12:
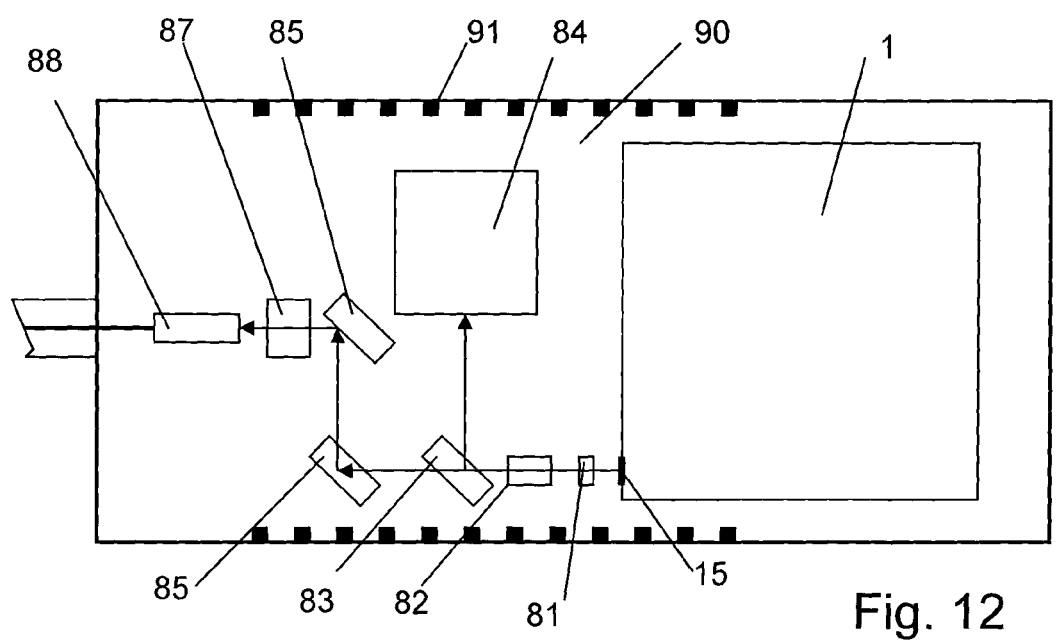
FIG. 12 is an illustration of a light source system comprising an external cavity laser.

A schematic illustration of a light source that comprises a laser 1 of the herein discussed kind is shown in FIG. 12. Outside the laser cavity of the external cavity laser 1 with the outcoupling mirror 15 being a reflective coating of the gain element or a separate element, a couple of components are arranged, including a collimation arrangement 81, an optional optical isolator 82, a beam splitter 83, beam steering re-directors 85, a coupling lens 87, and a fiber 88. The collimation arrangement 81 (for example a collimation lens or a plurality of lenses) together with the gain element serve to collimate the beam for beam propagation to a fiber or optical feedthrough, see below. The collimation arrangement may be or comprise an aspherical lens. Also, a GRIN lens or mirror could be used. In principle, also direct coupling into the fiber would be possible. The optional optical isolator 82 is preferably close to the laser 1 to prevent any reflections back into the laser cavity. The beam splitter 83 reflects a portion of the beam into a wavemeter 84 (or k-clock), such as a wavemeter described in WO 2010/111795. The beam steering re-directors 85, which are optional, can be realized with different approaches, such as by prisms, wedges, mirrors, combination of lenses to form a telescope, etc. . . . In general, such re-directors are passive but could also be active components like 1D or 2D MOEMS (micro-opto-electro-mechanical systems) for adjusting coupling efficiency. The closer the optical feed through is to laser 1, the less important is optical beam steering provided by such re-directors 85. The coupling lens 87 couples the beam into the optical feedthrough 88. Depending on how the feedthrough (which can be, e.g., a waveguide or a window) is realized, the lens is required or not. Again, mirrors or other types of focusing optics can be used. The fiber 88 serves as optical feedthrough. The fiber can be angle cleaved or polished in order to prevent back reflection back towards the laser 1. It is also possible to combine the fiber with a lens, for example a GRIN lens (straight or angled) glued onto a fiber, the coupling lens 87 and the fiber feedthrough 88 would together be conceived as a single component.

The above components may be used in combination, each alone, or in any sub-combination, depending on the needs.

All described elements in the depicted configuration are carried by a common substrate 90. The substrate can also be realized with several levels, e.g., to make possible different heights of optical axes above substrate 90, e.g., if, inside the laser a different beam diameter is preferred than for the fiber coupling, or to accommodate sub-assemblies on separate substrates (of different thicknesses). The substrate is preferably made of ceramics and relatively thick, for mechanical stability, e.g., at least 0.5 mm and/or at most 10 mm, or at least 1 mm and/or at most 6 mm.

The components held by the substrate are encased by a casing that provides mechanical protection. All constituents of the optical resonator can be arranged in the casing. The casing can in particular be hermetically closed, which can make possible to realize various environmental circumstances therein, e.g., the presence of a certain gas/gas mixture or a vacuum (of a certain degree). In addition to the optical feedthrough 88, the casing comprises a plurality of electrical feedthroughs 91, in particular for controlling the laser 1 and/or one or more others of the components.

Figure 23:
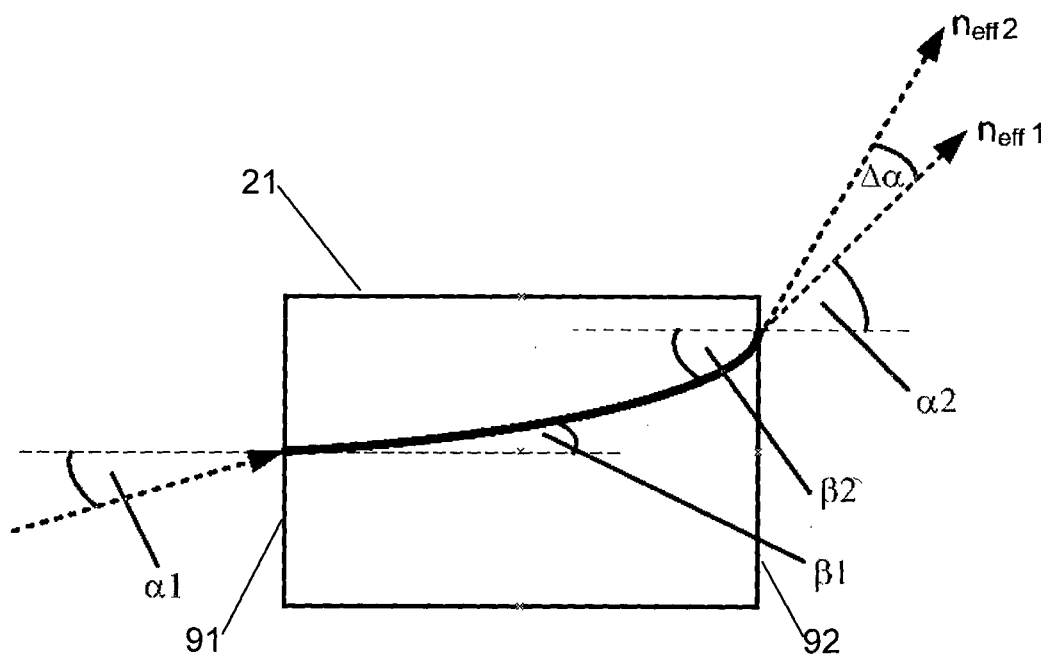
FIG. 23 is an illustration of an electro-optic deflector usable as a direction variation device.

As direction variation devices 21, various elements, devices or arrangements may be used, not only MEMS mirrors, but, e.g., vibrating optical fibers or electro-optic beam deflectors. In case of a vibrating optical fiber, a light beam from the gain element is fed into a first end of an optical fiber, and light exiting the optical fiber at a second end of the optical fiber propagates (under variation of its direction) to the wavelength selection element, wherein the direction variation is accomplished, e.g., by moving (vibrating) the second end of the fiber. In case of electro-optic beam deflectors, the light path in a material is varied using an electrical signal to which the material is exerted. The application of an electrical field, e.g., by applying a voltage to the material, or the injection of charge carriers can provoke a variation of the way light propagates in the material, more particularly, properties of the material are changed in such a way that an angle between a light beam incident on the material and the light beam exiting the material after having propagated through the material can be varied. This is schematically sketched in FIG. 23 in a top view, in which α1≠α2 indicates the deflection. The direction of the arrows indicates a light path from the light-generating element, i.e. from a gain device, through a semiconductor structure 21 towards a wavelength selection element. The return path is the same but not indicated in this figure.

Light enters the device 21 (comprising a suitably structured material) at first interface 91 (front facet) under an angle α1. The angle of incidence (AOI) α1 can be zero, which would refer to normal (perpendicular) incidence, or can be a few degrees (e.g., 1° to 7°) in order to minimize unwanted reflections at this first interface. In order to suppress unwanted reflections, an anti-reflection coating (ARC) can applied to this first interface. Inside device 21, the light travels along an optical waveguide. At the first interface 91, the optical waveguide has a tilt angle of β1. Optimum coupling (from free space/ambient air) into device 21 (more particular into the waveguide thereof) occurs when α1 and β1 obey the diffraction law of Snellius:

$$n_{ext} \sin(\alpha 1) = n_{eff} \sin(\beta 1)$$

Where $n_{eff}$ is the effective mode index inside the semiconductor device 21), and $n_{ext}$ is the index of refraction of the material outside device 21 (at the first interface), which usually is ambient air (or another gas or vacuum), the index of refraction $n_{ext}$ thus being around unity. For semiconductor devices, $n_{eff}$ is typically in the range of 3.0 to 3.5, depending on the design of the optical waveguide (such as the waveguide dimensions and the surrounding semiconductor material). Thus, the tilt angle β1 of the optical waveguide at the first interface 91 is typically in the range of 0° to 2°.

The light travelling inside the optical waveguide is entering the second interface 92 under an AOI β2 larger than the angle β1. The exiting light from the electro-optical deflector 21 is diffracted under an angle α2 with β2 and α2 obeying the law of Snellius:

$$n_{eff} \sin(\beta 2) = n_{ext} \sin(\alpha 2)$$

In a possible realization of an electro-optical deflector, the angle β2 is in the range of 10°-20°, depending on the value and range of $n_{eff}$. This means that the exiting angle α2 then is in the range of 30° to 90°, where larger angles may be particularly helpful in the present invention.

Importantly, the effective mode index of device 21 can be changed by applying an electrical signal to device 21, for example a voltage signal or a current signal. A voltage signal is usually applied by applying an electrical signal in reverse direction, such as by connecting a positive (plus) terminal of an electrical power source to an n-layer and the negative (minus) terminal to a p-layer; and a current signal is usually applied by applying an electrical signal in forward direction, such as by connecting a positive (plus) terminal of an electrical power source to a p-layer and the negative (minus) terminal to an n-layer. Index changes through electrical voltages in reverse direction are known and can be described by the Franz-Keldysh effect. However, this effect is generally more effective in changing the optical absorption by applying an electrical signal than in changing refraction. For practical realizations of semiconductor-based electro-optic beam deflectors, the effective mode index will therefore rather be varied by current injection (applying an electrical signal in forward direction. Note that the p and n contacts are illustrated, e.g., in FIGS. 24, 27 and 28, wherein it is to be noted that p and n contacts could, in principle, be interchanged with respect to what is described.

In an example, deflection variation angles Δα of 3° to 10° are desired, that means by changing the electrical drive signal, the exiting angle α2 shall change by 3° to 10°. The amount of index change usually is limited by the design of the active region (in which the light propagates in device 21) and by the applicability of electrical signals. But an increased deflection variation angle Δα may be achievable by increasing the waveguide tilt angle β2. Consequently, the exiting angle α2 may increase up to its maximum possible value of 90°. When design parameters are properly adjusted, it is possible to achieve, e.g., that small index changes of 0.1 can already be sufficient to generate deflection variation angles Δα of 5° to 10°.

The light exiting from the deflector 21 is launched, e.g., towards a diffraction grating or an assembly of diffraction gratings and prisms described in the present patent application. Besides the angle of propagation α2, the exiting light has a divergence angle that is described by the numerical aperture (NA) of the optical waveguide of electro-optical deflector 21. This means that the exiting light has a beam diameter increasing while propagating. For that reason, the exiting light should to be collimated, e.g., by way of appropriate optical elements, when being used in combination with diffraction gratings. This may be accomplished, e.g., by using ball lenses. Another option is the use of a concave diffraction grating, e.g., like described for FIG. 20, accomplishing beam collimation for divergent beams. Electro-optic beam deflectors based on non-linear optical crystals not comprising a waveguide usually do not show an increased divergence of deflected beams.

The active region of the semiconductor optical beam deflector 21 can be realized with a single quantum well (QW), having a thickness in the range of, e.g., 2 nm to 40 nm, or with multiple QWs having the same or different thickness values. The optical waveguide can be realized, e.g., with ridge waveguide devices or with buried waveguide devices, the latter typically producing a rounder mode profile which may be advantageous (in view of beam collimation and interfacing to other optical components).

FIGS. 24 to 28 further illustrate possible semiconductor-based electro-optical beam deflectors.

Figure 24:
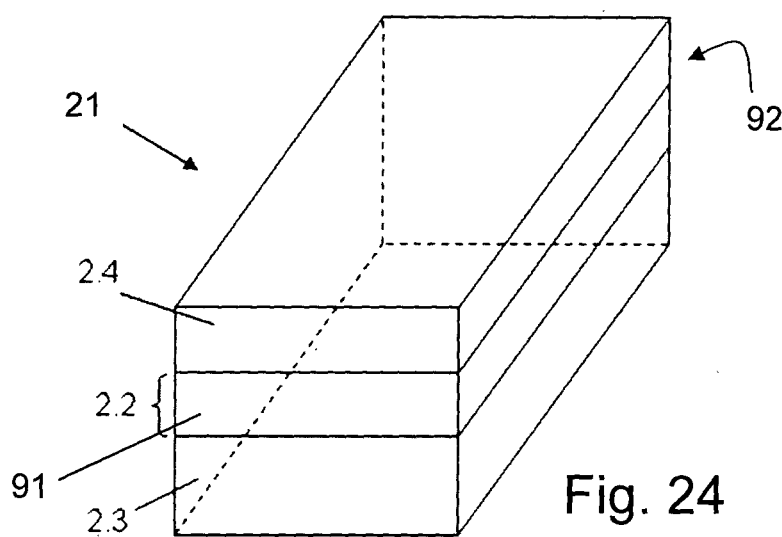
FIG. 24 is a schematic perspective view of an electro-optic beam deflector.

FIG. 24 is a schematic perspective view of an electro-optic deflector 21 with an active region 2.2 in which the light to be deflected propagates, a top layer 2.4 typically acting as the p-contact, and a bottom layer 2.3 typically acting as the n-contact.

Figures 25, 26:
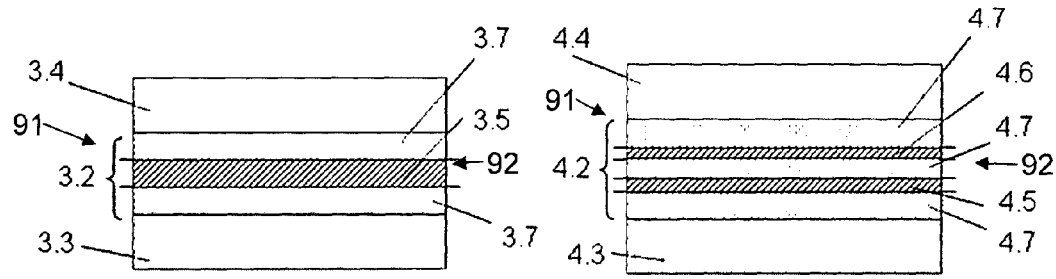
FIG. 25 is an elevation view of a semiconductor-based electro-optic beam deflector with one quantum well.
FIG. 26 is an elevation view of a semiconductor-based electro-optic beam deflector with two quantum wells.

FIG. 25 is side view of possible realization of a semiconductor deflector 21, showing top layer 3.4, active region 3.2 and bottom layer 3.3. The active region consists of one quantum well 3.5 surrounded by two barrier layers 3.7.

FIG. 26 is side view similar to FIG. 25, but the active region comprises more than one quantum well, specifically one quantum well 4.5 and at least one other one 4.6. The two or more quantum wells may have different stochiometric compositions and/or different thicknesses.

Figure 27:
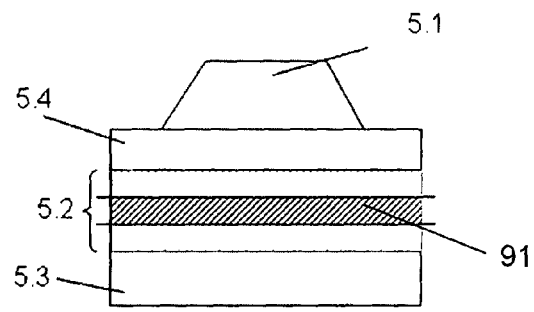
FIG. 27 is a front or back (facet) view of a semiconductor-based electro-optic beam deflector with a ridge waveguide structure.

FIG. 27 is a front or back (facet) view of semiconductor deflector device 21 with a ridge waveguide structure, showing a ridge 5.1 which usually is formed by etching of semiconductor material, an upper layer 5.4, an active region 5.2 and a lower layer 5.3. Typically, the electrical p-contact is realized on top of the ridge 5.1, and the electrical re-contact is realized at the bottom of the lower layer 5.3.

The bottom of the lower layer might be a semiconductor substrate on which the semiconductor epitactically grown structure is grown on, for example a GaAs, InP or GaN substrate.

Figure 28:
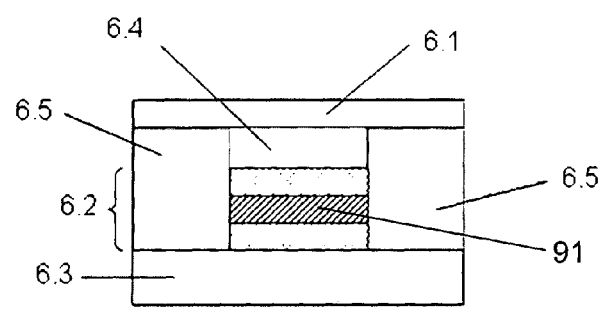
FIG. 28 is a front or back (facet) view of a semiconductor-based electro-optic beam deflector with a buried waveguide structure.

FIG. 28 is a front or back (facet) view of a semiconductor deflector device 21 with a buried waveguide structure, showing an upper layer 6.4, an active region 6.2 and a lower layer 6.3, lower layer 6.3 usually serving as an n-contact. The waveguide can be formed, e.g., by etching through the active region down to the lower layer 6.3 and then regrowing another semiconductor material 6.5 having a lower refractive index, followed by another regrown top (cap) layer 6.1 acting as an electrical contact layer, typically the p-contact.

What is claimed is:

1. A light source, comprising:
 a semiconductor gain device operable to provide light amplification;
 a wavelength selection element comprising a diffraction grating; and
 light re-directors;
 wherein the semiconductor gain device, the light re-directors and the diffraction grating are mutually arranged so that an optical resonator is established for light portions emitted by the gain device and diffracted by the diffraction grating;
 wherein the optical resonator is an external cavity laser resonator;
 wherein the light source comprises a direction variation device capable of varying a direction of light incident on the wavelength selection element to select a resonator radiation wavelength dependent on the angle of incidence of the light on the wavelength selection element, and
 wherein the direction variation device comprises at least one of
 a beam deflection arrangement with a movable element for deflecting the light;
 a portion of material capable of varying a direction of propagation of light propagating in the material by applying an electrical signal to the material.

2. The light source according to claim 1, wherein the direction variation device comprises a movable mirror.

3. The light source according to claim 1, wherein said portion of material is a semiconductor structure or a non-linear optical crystal.

4. The light source according to claim 1, wherein the direction variation device is arranged between the gain device and the wavelength selection element to deflect light coming from the gain device to have a variable angle of incidence on the wavelength selection element.

5. The light source according to claim 1, wherein the wavelength selection element comprises the diffraction grating attached to a prism.

6. The light source according to claim 1, further comprising a periodic filter, wherein the periodic filter is a Fabry-Perot etalon comprised in the wavelength selection element.

7. The light source according to claim 1, wherein the wavelength selection element comprises a reflective end surface that constitutes an end element of the optical resonator.

8. A light source, comprising:
 a semiconductor gain device operable to provide light amplification;
 a wavelength selection element comprising a diffraction grating attached to a prism; and
 light re-directors;
 wherein the semiconductor gain device, the light re-directors and the diffraction grating are mutually arranged so that an optical resonator is established for light portions emitted by the gain device and diffracted by the diffraction grating;
 wherein the optical resonator is an external cavity laser resonator; and
 wherein the light source comprises a direction variation device capable of varying a direction of light incident on the wavelength selection element to select a resonator radiation wavelength dependent on the angle of incidence of the light on the wavelength selection element.

9. The light source according to claim 8, wherein the diffraction grating is a transmission diffraction grating.

10. The light source according to claim 8, wherein the direction variation device is arranged between the gain device and the wavelength selection element to deflect light coming from the gain device to have a variable angle of incidence on the wavelength selection element.

11. The light source according to claim 8, wherein the diffraction grating is a transmission diffraction grating arranged between a first and a second prism.

12. The light source according to claim 11, wherein the diffraction grating is attached to said first and second prisms.

13. The light source according to claim 8, wherein the angle of incidence of radiation from the direction variation device on the prism is more obtuse for light of relatively smaller wavelength for which the resonator condition is fulfilled than for light of relatively larger wavelength for which the resonator condition is fulfilled.

14. The light source according to claim 8, further comprising a periodic filter.

15. The light source according to claim 14, wherein the periodic filter is a Fabry-Perot etalon comprised in the wavelength selection element, and wherein the Fabry-Perot etalon is arranged such that an angle of incidence on the Fabry-Perot etalon of light circulating in the resonator is different from 0°.

16. The light source according to claim 8, wherein the wavelength selection element comprises a reflective end surface that constitutes an end element of the optical resonator.

17. A light source, comprising:
 a semiconductor gain device operable to provide light amplification;
 a wavelength selection element comprising a diffraction grating; and
 light re-directors;
 wherein the semiconductor gain device, the light re-directors and the diffraction grating are mutually arranged so that an optical resonator is established for light portions emitted by the gain device and diffracted by the diffraction grating;
 wherein the optical resonator is an external cavity laser resonator;
 wherein the light source comprises a direction variation device capable of varying a direction of light incident on the wavelength selection element to select a resonator radiation wavelength dependent on the angle of incidence of the light on the wavelength selection element; and
 wherein the light source further comprises an optical retarder arranged in the optical resonator on the same side of the wavelength selection element as the gain device.

18. The light source according to claim 17, wherein the direction variation device is arranged between the gain device and the wavelength selection element to deflect light coming from the gain device to have a variable angle of incidence on the wavelength selection element.

19. A light source, comprising:
a semiconductor gain device operable to provide light amplification;
a wavelength selection element comprising a diffraction grating; and
light re-directors;
wherein the semiconductor gain device, the light re-directors and the diffraction grating are mutually arranged so that an optical resonator is established for light portions emitted by the gain device and diffracted by the diffraction grating;
wherein the optical resonator is an external cavity laser resonator;
wherein the light source comprises a direction variation device capable of varying a direction of light incident on the wavelength selection element to select a resonator radiation wavelength dependent on the angle of incidence of the light on the wavelength selection element;
wherein the light source, further comprises a deflection arrangement;
wherein light guided in the resonator defines a first plane and a second plane different from the first plane; and
wherein the deflection arrangement deflects light circulating in the resonator from the first plane to the second plane.

20. The light source according to claim 19, wherein the direction variation device is arranged between the gain device and the wavelength selection element to deflect light coming from the gain device to have a variable angle of incidence on the wavelength selection element.

21. The light source according to claim 19, wherein the direction variation device comprises at least one of
a beam deflection arrangement with a movable element for deflecting the light;
a portion of material capable of varying a direction of propagation of light propagating in the material by applying an electrical signal to the material.

22. The light source according to claim 19, wherein the wavelength selection element comprises the diffraction grating attached to a prism.

23. The light source according to claim 19, comprising a retarder, wherein light circulating in the resonator in the retarder propagates in the first plane, and light circulating in the resonator in the wavelength selection element propagates in the second plane.

24. A light source, comprising:
a first semiconductor gain device operable to provide light amplification;
a wavelength selection element comprising a diffraction grating; and
light re-directors;
wherein the semiconductor gain device, the light re-directors and the diffraction grating are mutually arranged so that an optical resonator is established for light portions emitted by the gain device and diffracted by the diffraction grating;
wherein the optical resonator is an external cavity laser resonator;
wherein the light source comprises a direction variation device capable of varying a direction of light incident on the wavelength selection element to select a resonator radiation wavelength dependent on the angle of incidence of the light on the wavelength selection element;
wherein the light source further comprises a second semiconductor gain device operable to provide light amplification, and
wherein the direction variation device is arranged so as to be capable of receiving light amplified in the first semiconductor gain device and light amplified in the second semiconductor gain device and of varying a direction of further propagation of received light.

25. The light source according to claim 24, wherein the direction variation device is arranged between the first semiconductor gain device and the wavelength selection element to deflect light coming from the first semiconductor gain device to have a variable angle of incidence on the wavelength selection element.

26. The light source according to claim 24, wherein the direction variation device comprises at least one of
a beam deflection arrangement with a movable element for deflecting the light;
a portion of material capable of varying a direction of propagation of light propagating in the material by applying an electrical signal to the material.

27. The light source according to claim 24, wherein the wavelength selection element comprises the diffraction grating attached to a prism.

28. The light source according to claim 24, wherein at least one beam splitter is provided for forming at least two separate beam paths, said first and second semiconductor gain devices being arranged in different ones of said at least two separate beam paths.

29. The light source according to claim 28, wherein said at least two separate beam paths are formed in the same optical resonator or in partially overlapping optical resonators.

30. The light source according to claim 24, wherein:
in addition to the before-addressed first wavelength selection element, a second wavelength selection element is provided, the second semiconductor gain device, the before-addressed and/or further light re-directors and the second wavelength selection element being mutually arranged so that an additional, second optical resonator is established for light portions emitted by the second semiconductor gain device,
the second optical resonator is an external cavity laser resonator, and
the direction variation device is capable of varying a direction of light incident on the second wavelength selection element to select a resonator radiation wavelength dependent on the angle of incidence of the light on the second wavelength selection element.

31. An optical coherence tomography apparatus, the apparatus comprising a light source comprising:
a semiconductor gain device operable to provide light amplification;
a wavelength selection element comprising a diffraction grating; and
light re-directors;
wherein the semiconductor gain device, the light re-directors and the diffraction grating are mutually arranged so that an optical resonator is established for light portions emitted by the gain device and diffracted by the diffraction grating;
wherein the optical resonator is an external cavity laser resonator; and wherein the light source comprises a direction variation device capable of varying a direction of light incident on the wavelength selection element to select a resonator radiation wavelength dependent on the angle of incidence of the light on the wavelength selection element; and wherein the apparatus further comprises:

a portion of an interferometer in optical communication with the light source;

the portion of the interferometer being operable to combine a portion of light produced by the light source and returned from the sample with a portion of light produced by the light source and returned to the interferometer via a reference path; and a detector unit positioned to receive so-combined light from the interferometer.

32. The apparatus according to claim 31, wherein the direction variation device comprises at least one of a beam deflection arrangement with a movable element for deflecting the light;

a portion of material capable of varying a direction of propagation of light propagating in the material by applying an electrical signal to the material.

33. The apparatus according to claim 31, wherein the wavelength selection element comprises the diffraction grating attached to a prism.

34. The apparatus according to claim 31, wherein the light source further comprises an optical retarder arranged in the optical resonator on the same side of the wavelength selection element as the gain device.

35. The apparatus according to claim 31, wherein the light source further comprises a deflection arrangement, wherein light guided in the resonator defines a first plane and a second plane different from the first plane, and wherein the deflection arrangement deflects light circulating in the resonator from the first plane to the second plane.

36. The apparatus according to claim 31, wherein the light source comprises, in addition to the before-addressed first semiconductor gain device, a second semiconductor gain device operable to provide light amplification, wherein the direction variation device is arranged so as to be capable of receiving light amplified in the first semiconductor gain device and light amplified in the second semiconductor gain device and of varying a direction of further propagation of received light.

37. The apparatus according to claim 31, wherein the direction variation device is arranged between the gain device and the wavelength selection element to deflect light coming from the gain device to have a variable angle of incidence on the wavelength selection element.

38. The apparatus according to claim 31, wherein the light source further comprises a Fabry-Perot etalon comprised in the wavelength selection element.

\* \* \* \* \*